(12) United States Patent
Jones et al.

(10) Patent No.: US 8,995,546 B2
(45) Date of Patent: Mar. 31, 2015

(54) SOFTWARE DEFINED RADIO

(71) Applicant: Astrapi Corporation, Dallas, TX (US)

(72) Inventors: Nigel Jones, Frederick, MD (US);
Jerrold Prothero, Washington, DC (US)

(73) Assignee: Astrapi Corporation, Dallas, TX (US)

( * ) Notice: Subject to any disclaimer, the term of this patent is extended or adjusted under 35 U.S.C. 154(b) by 0 days.

(21) Appl. No.: 14/200,220

(22) Filed: Mar. 7, 2014

(65) Prior Publication Data

US 2014/0254698 A1 Sep. 11, 2014

Related U.S. Application Data

(60) Provisional application No. 61/774,253, filed on Mar. 7, 2013.

(51) Int. Cl.
*H04B 1/00* (2006.01)
(52) U.S. Cl.
CPC ..................................... *H04B 1/001* (2013.01)
USPC ......................................................... 375/261
(58) Field of Classification Search
USPC .......................................... 375/316, 324, 216
See application file for complete search history.

(56) References Cited

U.S. PATENT DOCUMENTS

| 8,223,890 | B1 * | 7/2012 | Su .................................. 375/324 |
| 8,401,117 | B1 * | 3/2013 | Su .................................. 375/316 |
| 2003/0067990 | A1 | 4/2003 | Bryant |
| 2005/0190827 | A1 * | 9/2005 | Xu et al. ....................... 375/222 |
| 2006/0067416 | A1 * | 3/2006 | Tirkkonen et al. ............ 375/260 |
| 2007/0230587 | A1 | 10/2007 | Scheytt |
| 2008/0130714 | A1 | 6/2008 | Wilborn et al. |
| 2008/0242347 | A1 * | 10/2008 | Zetterman et al. .......... 455/552.1 |
| 2009/0154333 | A1 * | 6/2009 | Sivaswamy et al. .......... 370/203 |
| 2009/0154534 | A1 * | 6/2009 | Hassan ......................... 375/219 |
| 2009/0163167 | A1 * | 6/2009 | Hillery et al. ................. 455/296 |
| 2011/0138259 | A1 * | 6/2011 | Tan et al. ...................... 714/792 |
| 2011/0150048 | A1 * | 6/2011 | Prothero ....................... 375/211 |
| 2012/0249888 | A1 * | 10/2012 | Naik et al. .................... 348/726 |
| 2012/0263031 | A1 * | 10/2012 | Prothero et al. .............. 370/204 |

OTHER PUBLICATIONS

International Search Report and Written Opinion dated Jun. 26, 2014 from corresponding International Patent Application No. PCT/US2014/021541; 13 pgs.

* cited by examiner

*Primary Examiner* — Jaison Joseph
(74) *Attorney, Agent, or Firm* — Maier & Maier, PLLC

(57) ABSTRACT

A software defined radio is disclosed. The software defined radio may utilize a method for encoding a bit stream into non-periodic spiral-based symbol waveforms for transmission and reception. The method includes transmitting a signal constructed from one or more non-periodic modulation sets residing on a memory system of the software defined radio, where each modulation set corresponds to a symbol alphabet and provides non-periodic symbol waveforms corresponding to symbol bit sequences segmented by a microprocessor according to alphabet size. The method also includes receiving the signal constructed from one or more spiral modulation sets, wherein the signal from one or more spiral modulation sets are filtered and then fed to an analog to digital converter, where the signal constructed from the one or more spiral modulation sets is digitized and are fed to the microprocessor. A non-transitory computer storage media may also execute the method.

27 Claims, 9 Drawing Sheets

Bit-error rate curves for BPSK, QPSK, 8-PSK and 16-PSK, AWGN channel.

SOFTWARE DEFINED RADIO

CROSS-REFERENCE TO RELATED APPLICATIONS

This application claims priority to U.S. Provisional Patent Application No. 61/774,253 filed Mar. 7, 2013 and entitled APPLICATIONS OF NON-PERIODIC SIGNALS, the entire contents of which are hereby incorporated by reference

BACKGROUND

The utilization of non-periodic functions for telecommunication signaling may utilize waveforms derived from functions in either of the two equivalent forms:

$$f_g(t)e^{t \cdot \cos(2^{1-g}\pi)} e^{i \cdot t \cdot \sin(2^{1-g}\pi)} \quad (1)$$

or $$f_g(t) = e^{ti(2^{2-g})} \quad (2)$$

In these equations, i is the imaginary constant equal to $\sqrt{-1}$, t is the time parameter, and g has the effect of varying the geometry of the waveform where g=2 corresponds to a complex circle, as the above reduce to the Euler term $e^{ti}$. Known techniques such as Quadrature Amplitude Modulation or QAM are based on complex circles. Values of g>2 correspond to complex spirals of increasingly rapid growth and increasingly lower frequency.

There are other variations of these waveforms based on altering parameters including but not limited to amplitude, frequency, phase, signal duration and direction of rotation. There is also a unified way of specifying many possible variations of waveforms via the generalized spiral formula:

$$f_g(t) = [\kappa_0 e^{i\omega_0}] e^{[\kappa_1 e^{i\omega_1}](t+t_0)i[\kappa_2 e^{i\omega_2}](2^{2-g})} \quad (3)$$

Dropping the square brackets for conciseness, the general spiral formula (Equation 3) may be written as:

$$f_g(t) = \kappa_0 e^{i\omega_0} e^{\kappa_1 e^{i\omega_1}(t+t_0)i\kappa_2 e^{i\omega_2}(2^{2-g})} \quad (4)$$

The scope of this formula may be characterized by the effect of varying its parameters on the set of symbol waveforms that may be generated. The effects of varying the parameters include amplitude modulation that utilizes multiple values of $\kappa_0$, phase modulation that utilize multiple values of $\omega_0$, time reversal that utilize $\kappa_1 = \pm 1$, or equivalently $\omega_1 = 0$ and $\omega_1 = a$, frequency modulation that has a scale $\kappa_1$, time shifts that utilize multiple values of $t_0$, rotational reversal that utilize $\kappa_2 = \pm 1$, or equivalently $\omega_2 = 0$ and $\omega_2 = \pi$, waveform shape modulation that vary g with higher values of g that correspond to more rapid growth and lower frequency and other variations with general values of $\kappa_2$, $e_1$, and $\omega_2$.

For the case of g=2, corresponding to the standard telecommunications conditions of no amplitude growth, the only parameters that are usually modified are amplitude, frequency and phase. By contrast, for signals where g>2, the generalized spiral formula shows that there are additional parameters, or degrees of freedom, available for encoding information in the signal. Of particular practical significance are time reversal, rotational reversal and waveform shape modulation.

The effect of these three additional degrees of freedom is to dramatically increase the number of possible modulation sets for a particular alphabet size. By way of example, consider a communications channel with an alphabet size of M=8, such that three bits are encoded per symbol. For non-spiral based communications, utilizing the standard technique of superposition of the I & Q waveforms, the possible modulation sets are shown in Table 1.

TABLE 1

Non-spiral modulation sets for an alphabet of 8

| Phases | Amplitudes | Frequencies | Symbols |
|---|---|---|---|
| 8 | 1 | 1 | 8 |
| 4 | 2 | 1 | 8 |
| 4 | 1 | 2 | 8 |
| 2 | 2 | 2 | 8 |
| 2 | 4 | 1 | 8 |
| 2 | 1 | 4 | 8 |
| 1 | 8 | 1 | 8 |
| 1 | 4 | 2 | 8 |
| 1 | 2 | 4 | 8 |
| 1 | 1 | 8 | 8 |

Thus one could encode the alphabet utilizing eight phases, one amplitude and one frequency (e.g. what is generally known as 8-PSK), or one could utilize four phases, two amplitudes and one frequency which if it was utilized practically would be referred to as 8-QAM and so on. As shown in Table 1 there are just ten possible modulation sets for non-spiral modulation for M=8.

For values of g>2, one may utilize time reversal to double the number of symbols, and then also utilize rotation reversal to double the number of symbols again. Thus for a particular value of growth g, the possible modulation sets are shown in Table 2.

TABLE 2

Spiral modulation sets for an alphabet of 8 and just one growth value.

| Phases | Amplitudes | Frequencies | Rotation | Time | Symbols |
|---|---|---|---|---|---|
| 8 | 1 | 1 | 0 | 0 | 8 |
| 4 | 2 | 1 | 0 | 0 | 8 |
| 4 | 1 | 2 | 0 | 0 | 8 |
| 2 | 2 | 2 | 0 | 0 | 8 |
| 2 | 4 | 1 | 0 | 0 | 8 |
| 2 | 1 | 4 | 0 | 0 | 8 |
| 1 | 8 | 1 | 0 | 0 | 8 |
| 1 | 4 | 2 | 0 | 0 | 8 |
| 1 | 2 | 4 | 0 | 0 | 8 |
| 1 | 1 | 8 | 0 | 0 | 8 |
| 8 | 1 | 1 | 0 | 0 | 8 |
| 4 | 2 | 1 | 0 | 0 | 8 |
| 4 | 1 | 2 | 0 | 0 | 8 |
| 4 | 1 | 1 | 1 | 0 | 8 |
| 4 | 1 | 1 | 0 | 1 | 8 |
| 2 | 2 | 2 | 0 | 0 | 8 |
| 2 | 4 | 1 | 0 | 0 | 8 |
| 2 | 1 | 4 | 0 | 0 | 8 |
| 2 | 2 | 1 | 1 | 0 | 8 |
| 2 | 2 | 1 | 0 | 1 | 8 |
| 2 | 1 | 2 | 1 | 0 | 8 |
| 2 | 1 | 2 | 0 | 1 | 8 |
| 2 | 1 | 1 | 1 | 1 | 8 |
| 1 | 8 | 1 | 0 | 0 | 8 |
| 1 | 4 | 2 | 0 | 0 | 8 |
| 1 | 2 | 4 | 0 | 0 | 8 |
| 1 | 1 | 8 | 0 | 0 | 8 |

TABLE 2-continued

Spiral modulation sets for an alphabet of 8 and just one growth value.

| Phases | Amplitudes | Frequencies | Rotation | Time | Symbols |
|---|---|---|---|---|---|
| 1 | 4 | 1 | 1 | 0 | 8 |
| 1 | 4 | 1 | 0 | 1 | 8 |
| 1 | 2 | 1 | 1 | 1 | 8 |
| 1 | 1 | 4 | 1 | 0 | 8 |
| 1 | 1 | 4 | 0 | 1 | 8 |
| 1 | 1 | 2 | 1 | 1 | 8 |

As shown in Table 2, there are approximately 32 different modulation sets for spiral-based communications with an 8-symbol alphabet. However, this represents approximately 32 possible combinations for just a single value of growth "g". Practical values of "g" vary from approximately 2.1 to 3.0, with noticeable differences being observable at steps of approximately 0.05. I.e., a symbol set with a g value of approximately 2.60 will exhibit noticeably different properties when compared to a symbol set with a g value of approximately 2.65. As such there are approximately [2.1 3.0 0.05] =18 useful values of g, giving an overall number of modulation combinations for an 8-symbol alphabet of approximately 32*18=576. This is 576/10=58 times more combinations when compared to non-spiral communications given an 8-symbol alphabet.

For larger alphabet sizes such as approximately 64, the number of possible modulation sets becomes enormous for spiral based modulation. While the mathematics behind spiral based communications is complex, the implementation need not be. For the transmitter, the result of the mathematics may be a simple lookup table which is indexed by symbol number and time. These values are sent to a Digital-Analog Converter or DAC whose output feeds into a radio frequency or RF stage which is typically either a mixer or directly into a power amplifier. The symbols are transmitted across the communications channel, and a version of the symbols generally corrupted by channel conditions is digitized at the receiver. The digitized symbols may then be fed through a series of matched filters in order to determine the received symbol.

It may be desirable for a communication system to use different modulation sets at different times, either due to changing channel conditions or for enhanced security. From an implementation perspective, a spiral based transceiver may evaluate at run time the complex equations necessary for synthesizing the transmitter look-up table/receiver matched filter coefficients and thus generate the necessary data on the fly, or have the data for the various modulation sets computed off line and the results simply stored in the memory system.

For a typical application with an alphabet size of approximately 64, and approximately 32 samples per symbol, the transmitter look-up table includes just 64*32=2048 values, with each value being typically represented by approximately 16 bits, giving a table size of approximately 4096 bytes per modulation set. Thus in typical memory system sizes available today, it is possible to store thousands of possible modulation sets and thus the latter approach of pre-computing modulation set data makes more sense.

A further benefit of storing thousands of modulation sets in memory is that it permits modulation sets to be instantaneously switched. This results in significant benefits as will be described. To comprehend the value of switching modulation, it is helpful to know some empirical results of investigations into spiral based modulation. Different spiral modulation combinations have markedly different characteristics in the presence of various channel impairments. For example, some modulation combinations work better with Additive White Gaussian Noise or AWGN, whereas others perform better in the presence of coherent noise. For a given channel impairment (e.g. coherent noise), there is a subset of the possible modulation combinations that perform optimally, and an even larger subset of the possible modulation combinations that perform acceptably. Some modulation combinations impose higher demands upon the underlying hardware than other combinations. For example, modulation combinations with higher g values typically require power amplifiers that may slew more rapidly and concomitantly analog to digital converters or ADC that may sample the signal more rapidly. Since spiral based signals are not periodic, the Nyquist sampling theorem does not apply and thus the band-limited received signal must be measured at multiple points in order to determine its shape. In general, the performance of spiral based communications may be arbitrarily improved by increasing the number of samples taken at the receiver. However, as the sample rate increases, so too do the demands on the ADC and subsequent digital filters. Thus it is possible to trade off communications performance with hardware cost and the amount of power required to run the ADC and subsequent digital filters. This has enormous implications for certain types of communications applications, as will be described.

It should be apparent that spiral based communications offers tremendous flexibility when compared to traditional forms of communications. While this flexibility may be exploited in the design of any given communications channel, it is particularly beneficial when implemented in a software defined radio or SDR. In a SDR, some or all of the features that traditionally were implemented in hardware are instead implemented in software such as non-transitory storage media. Typically this includes functions such as mixing, demodulation, modulation, filtering, phase locking and so on. Indeed, a state of the art SDR includes a powerful microprocessor, high speed ADC, high speed DAC, a power amplifier and an antenna. All of the radio functions are implemented in the microprocessor's non-transitory storage media. As such, an SDR is the perfect vehicle for exploiting the flexibility of spiral based communications.

SUMMARY OF THE INVENTION

Embodiments of the present invention relate to combining the markedly different characteristics of different spiral modulation sets with the dynamic configurability of spiral based communications so as to improve the performance of various types of communication channels.

In a first exemplary embodiment of the invention, a spiral based communications channel may change its modulation set as channel conditions change so as to maintain channel performance.

In a second exemplary embodiment of the invention, the dynamic configurability of spiral based communications may be exploited so as to minimize average power consumption of the transmitter.

In a third exemplary embodiment of the invention, the dynamic configurability of spiral based communications may be exploited so as to minimize peak power consumption of the transmitter.

In a fourth exemplary embodiment of the invention, the dynamic configurability of spiral based communications may be exploited so as to minimize average power consumption of the receiver.

In a fifth instance of the invention, the dynamic configurability of spiral based communications may be exploited so as minimize average power consumption across the communications network.

BRIEF DESCRIPTION OF THE DRAWINGS

Advantages of embodiments of the present invention will be apparent from the following detailed description of the exemplary embodiments thereof, which description should be considered in conjunction with the accompanying drawings in which like numerals indicate like elements, in which.

DETAILED DESCRIPTION

Aspects of the present invention are disclosed in the following description and related figure directed to specific embodiments of the invention. Those skilled in the art will recognize that alternate embodiments may be devised without departing from the spirit or the scope of the claims. Additionally, well-known elements of exemplary embodiments of the invention will not be described in detail or will be omitted so as not to obscure the relevant details of the invention.

As used herein, the word "exemplary" means "serving as an example, instance or illustration." The embodiments described herein are not limiting, but rather are exemplary only. It should be understood that the described embodiments are not necessarily to be construed as preferred or advantageous over other embodiments. Moreover, the terms "embodiments of the invention", "embodiments" or "invention" do not require that all embodiments of the invention include the discussed feature, advantage or mode of operation.

Figure 1:
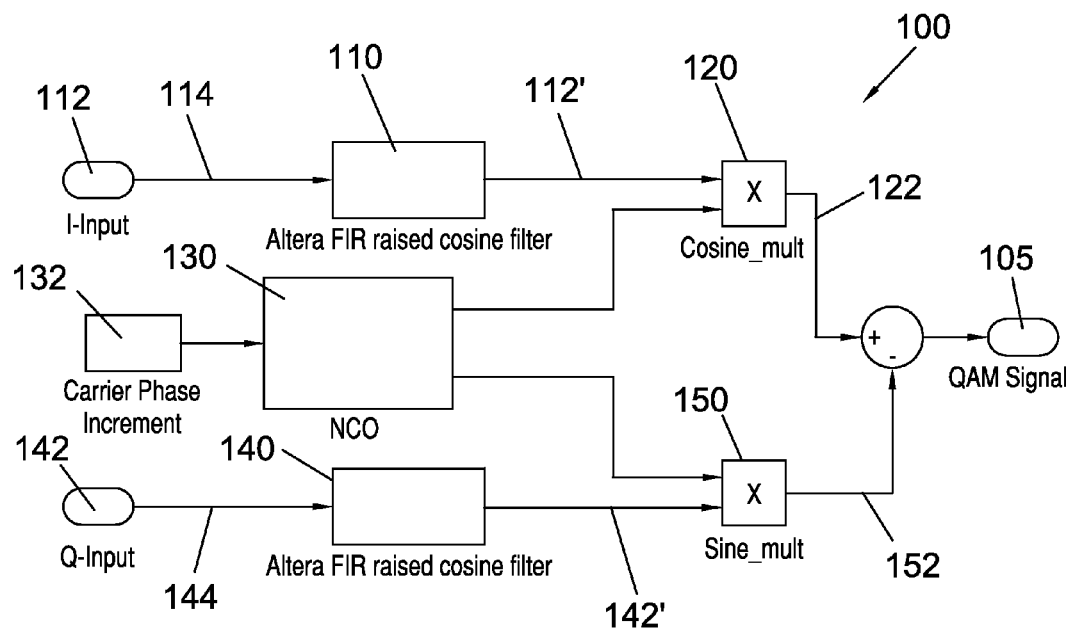
FIG. 1 is an exemplary diagram showing a block diagram of a QAM modulator.

FIG. 1 is an exemplary diagram showing a block diagram 100 of a QAM modulator. The QAM modulator 100 may produce a QAM signal 105. The QAM modulator 100 may include a first finite impulse response or first FIR cosine filter 110, a cosine multiplexor 120, a numerically controlled oscillator 130, a second finite impulse response or second FIR cosine filter 140 and a sine multiplexor 150. The first finite impulse response or first FIR cosine filter 110 may receive an input signal 112 such as an I-input signal 114 and filter the input signal. The cosine multiplexor 120 may receive the filtered input signal 112' and a signal from the numerically controlled oscillator 130 and forward the selected input into a single signal 122. The numerically controlled oscillator 130 may receive a signal from a phase increment source 132 that could generate waves with different frequencies. The second FIR cosine filter 140 may receive an input signal 142 such as a Q-input signal 144 and filter the input signal 142. The sine multiplexor 150 may receive the filtered input signal 142' and a signal from the numerically controlled oscillator 130 and forward the selected input into a single signal 152. The sum of 122 and 152 may be the QAM signal 105.

Figure 2:
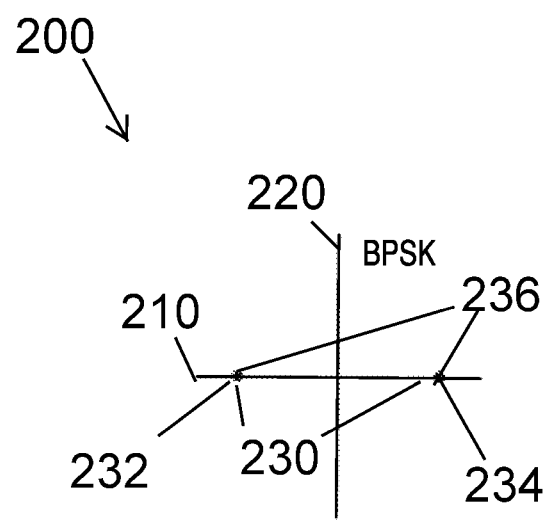
FIG. 2 is an exemplary diagram showing a constellation diagram for BPSK.

FIG. 2 is an exemplary diagram showing a constellation diagram 200 for binary phase shift keying or BPSK. The constellation diagram 200 may include an X-axis 210, a Y-axis 220 and a pair of points 230. The X-axis 210 may include a first point 232 of a pair of points 230. The X-axis 220 may include a second point 234 of a pair of points 230. The pair of points 230 may represent a pair of constellation points 236.

Figure 3:
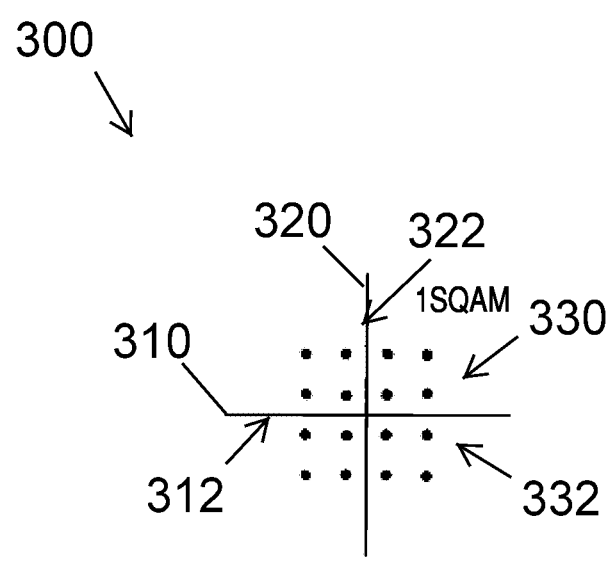
FIG. 3 is an exemplary diagram showing a constellation diagram for 16 QAM.

FIG. 3 is an exemplary diagram showing a constellation diagram 300 for 16 QAM. The constellation diagram 300 may include an X-axis 310, a Y-axis 320 and a plurality of points 330. The X-axis 310 may include a plurality of predetermined Quadrature or Q quantities 312. The Y-axis 320 may include a plurality of predetermined In-phase or I quantities 322. The pair of points 330 may represent approximately sixteen constellation points 332.

Figure 4:
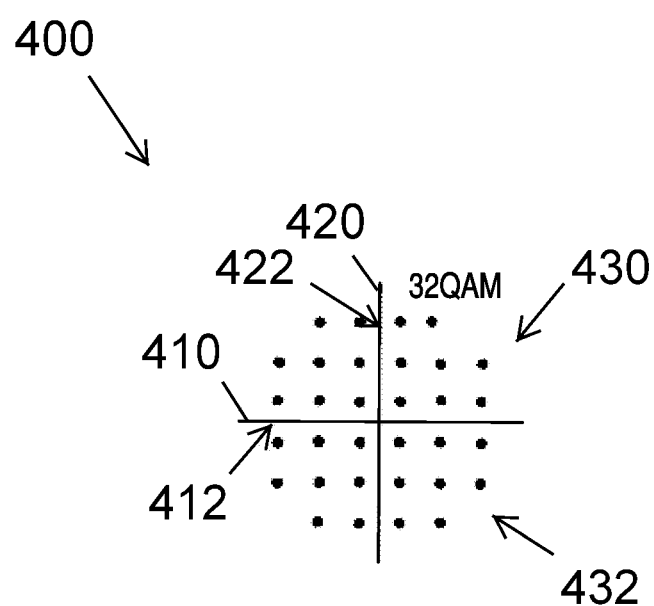
FIG. 4 is an exemplary diagram showing a constellation diagram for 32 QAM.

FIG. 4 is an exemplary diagram showing a constellation diagram 400 for 32 QAM. The constellation diagram 400 may include an X-axis 410, a Y-axis 420 and a plurality of points 430. The X-axis 410 may include a plurality of predetermined Quadrature or Q quantities 412. The Y-axis 420 may include a plurality of predetermined In-phase or I quantities 422. The points 430 may represent approximately thirty-two constellation points 432.

Figure 5:
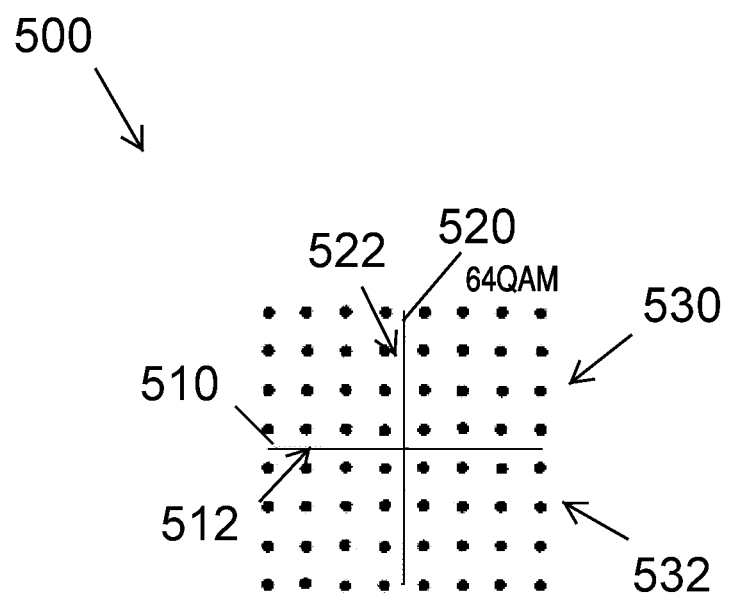
FIG. 5 is an exemplary diagram showing a constellation diagram for 64 QAM.

FIG. 5 is an exemplary diagram showing a constellation diagram 500 for 64 QAM. The constellation diagram 500 may include an X-axis 510, a Y-axis 520 and a plurality of points 530. The X-axis 510 may include a plurality of predetermined Quadrature or Q quantities 512. The Y-axis 520 may include a plurality of predetermined In-phase or I quantities 522. The points 530 may represent approximately sixty-four constellation points 532.

Figure 6:
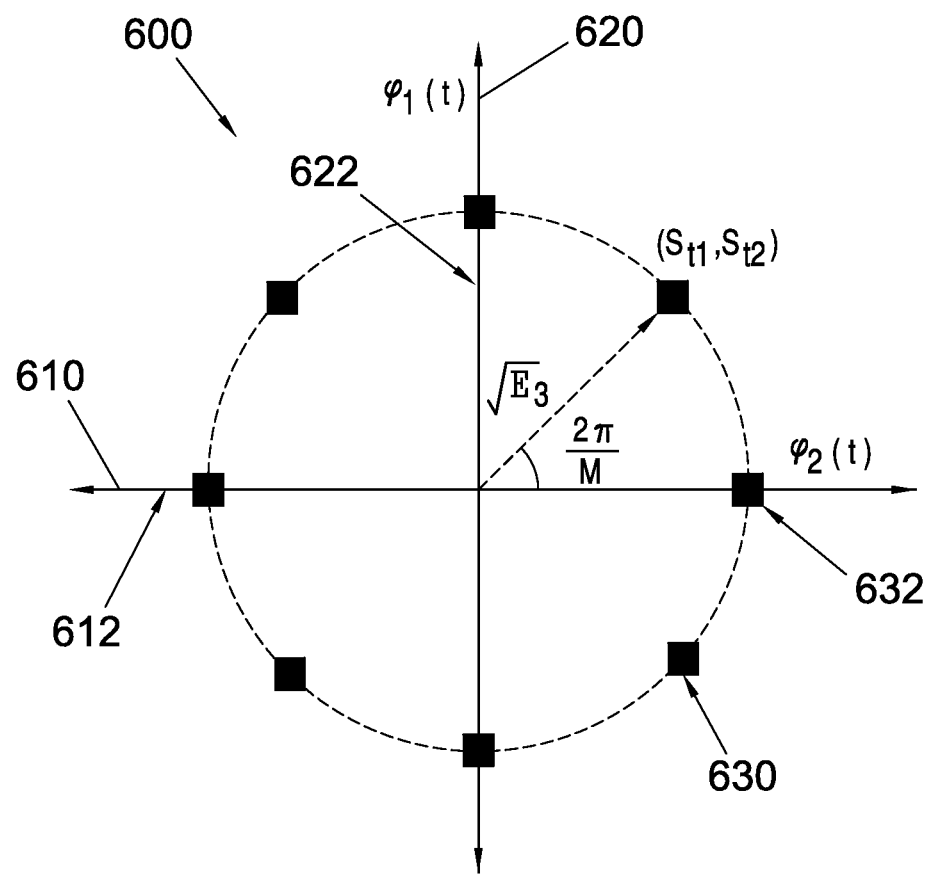
FIG. 6 is an exemplary diagram showing a graph of a 8-PSK constellation diagram

FIG. 6 is an exemplary diagram showing a graph 600 of a 8-PSK constellation diagram. The graph may include an X-axis 610, a Y-axis 620 and a plurality of points 630. The X-axis 610 may include a plurality of predetermined Quadrature or Q quantities 612. The Y-axis 620 may include a plurality of predetermined In-phase or I quantities 622. The points 630 may represent approximately eight constellation points 632.

Figure 7:
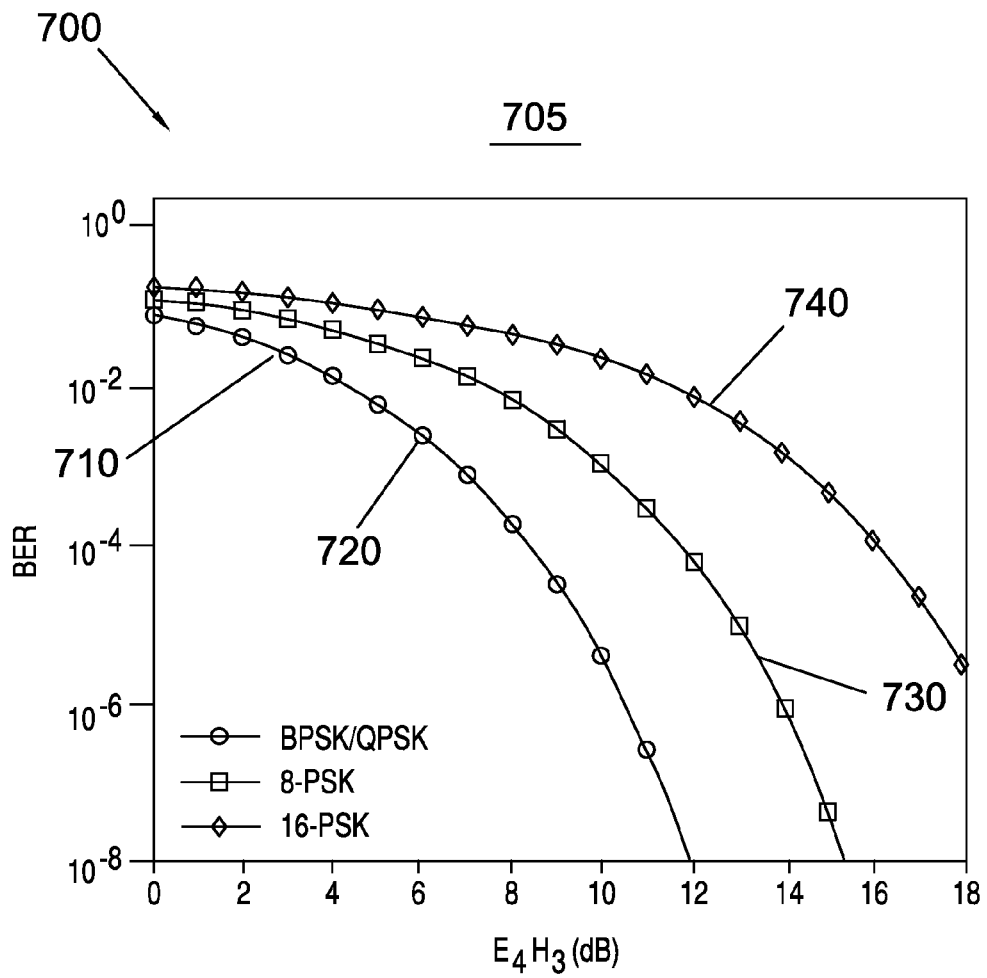
FIG. 7 is an exemplary diagram showing a graph of a bit rate curve for BPSK, QPSK, 8-PSK and 16-PSK channels.

FIG. 7 is an exemplary diagram showing a graph 700 of a plurality of bit-error rate curves. The graph 700 includes a BPSK bit-error rate curve 710, a QPSK bit-error rate curve 720, a 8-PSK bit-error rate curve 730 and a 16-PSK bit-error rate curve 740. The BPSK bit-error rate curve 710 may be for a AWGN channel 705. The QPSK bit-error rate curve 720 may be for a AWGN channel 705. The 8-PSK bit-error rate curve 730 may be for a AWGN channel 705. The 16-PSK bit-error rate curve 740 may be for a AWGN channel 705.

Figure 8:
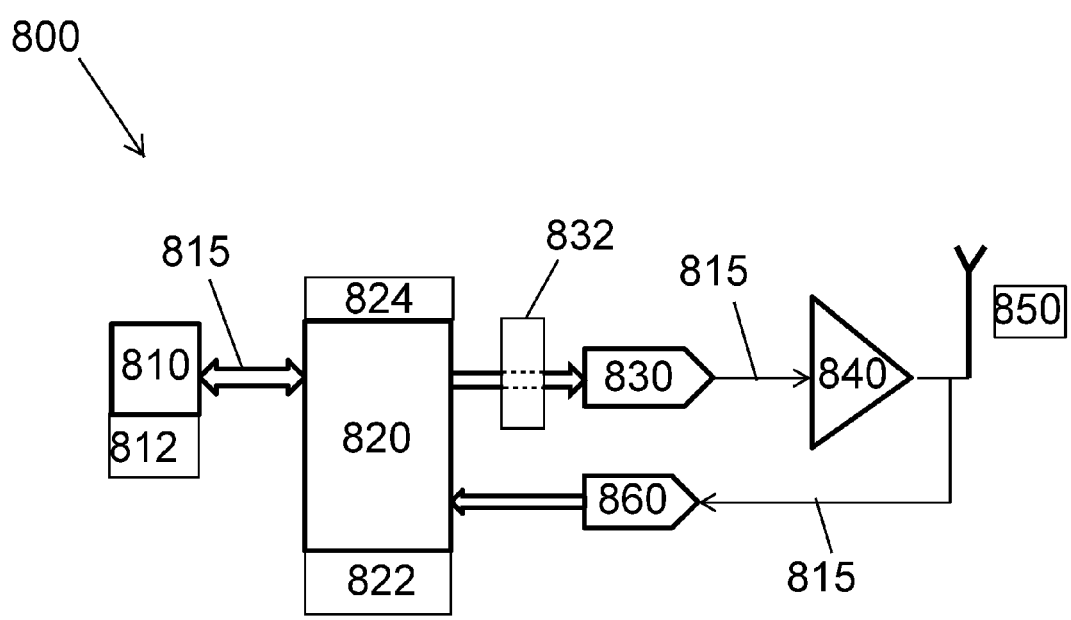
FIG. 8 is an exemplary diagram showing a block diagram of a software defined radio.

FIG. 8 is an exemplary diagram showing a block diagram of software defined radio or SDR 800, supporting both transmission and reception. FIG. 8 is a block diagram of a typical SDR 800 having a memory system 810, a microprocessor 820, a digital to analog converter 830, a power amplifier 840, an antenna 850 and an analog to digital converter 860. The memory system 810 may store a plurality of modulation sets 812. The memory system 810 may permit the modulation sets 812 to be instantaneously switched. The microprocessor 820 may be in communication with the memory system 810 via a bus 815. The microprocessor 820 may include a non-transitory storage media 822 where one or more radio functions may be implemented and a transmitter 824 to generate a bit stream. The non-transitory computer storage media 822 may dynamically select one or more spiral modulation sets to accommodate one or more changing channel conditions and may minimize average power consumption of the one or more spiral modulation sets so as to minimize average transmitted power and minimize power consumption. The one or more spiral modulation sets for a given channel impairment may be known a priori. Each of the one or more spiral modulation sets systematically may be tried to determine the one or more spiral modulation sets that work optimally. A heuristic algorithm may determine the one or more optimal spiral modulation sets. The one or more spiral modulation sets may be for Additive White Gaussian Noise or AWGN impaired channels to improve a received signal at one or more frequencies. The average transmitted power may be minimized and the one or more spiral modulation sets may change to minimize the average transmitted power. A plurality of modulation set data may be computed off line and stored in the memory system. The microprocessor 820 may segment the bit stream received from the modulation sets 812 residing on the memory system 810 according to modulation alphabet size. The microprocessor 820 may decide a priori how many of a plurality of samples will be transmitted per symbol. For signal transmission, the digital to analog converter 830 may be in communication with the microprocessor 820 via the bus 815. The digital to analog converter 830 may receive a plurality of spiral based symbol waveforms from the microprocessor 820. The digital to analog converter 830 may be driven by a bandwidth limiting filter 832 whose output may feed into a radio frequency or RF stage. The power amplifier 840 may be in communication with the digital to analog converter 830 via the bus 815. The power amplifier 840 may be driven by the bandwidth limiting filter 832. The antenna 850 may be in communication with the power amplifier 840 via the bus 815 . . . . The analog to digital converter 860 may provide signal reception, digitize an analog signal from the antenna 850 and feed the digitized analog signal back to the microprocessor 820.

While it is common for a SDR to perform a multitude of transformations on the data to be transmitted, including encryption, interleaving and forward error correction, these transformations are not germane to the present invention. Rather, as such transformations are known to one having skill in the art, the descriptions thereof are omitted, and it is assumed that all requisite transformations have been performed resulting in a bit stream that needs to be transmitted. Once this stage has been reached, an SDR may perform the following steps or method in order to transmit the bit stream utilizing spiral based encoding.

Figure 9:
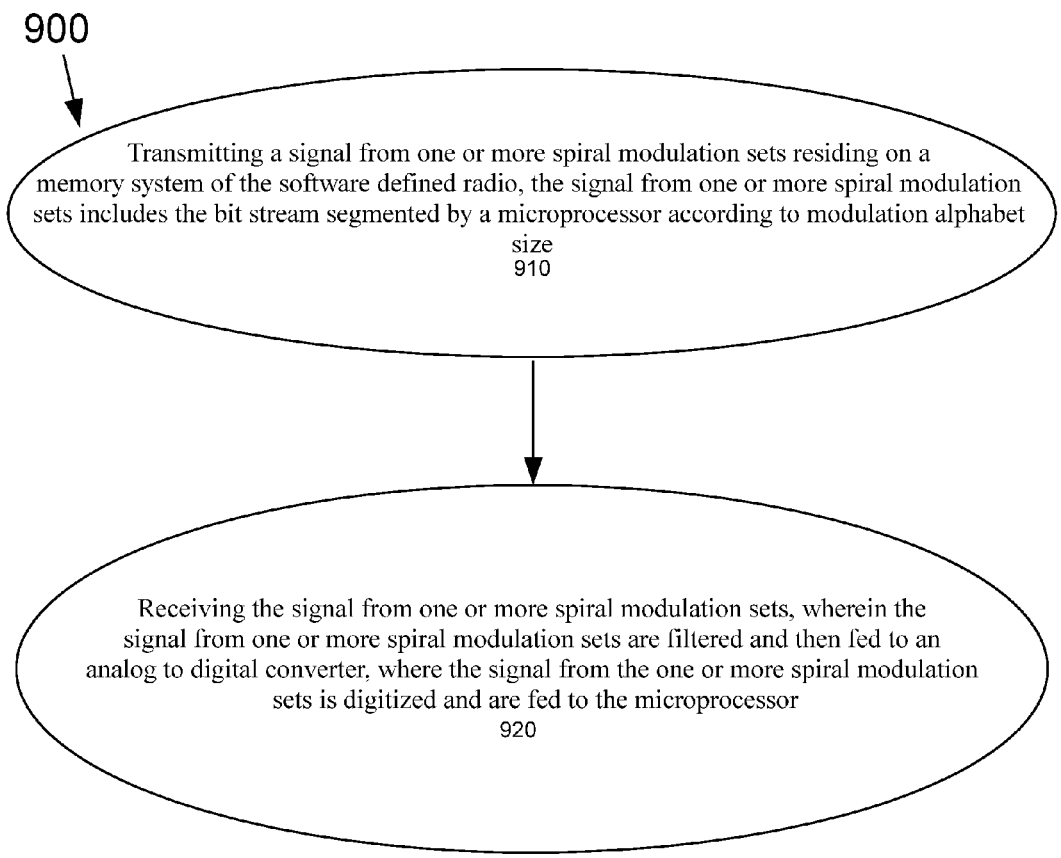
FIG. 9 is a flowchart showing a method for utilizing a bit stream for spiral based encoding.

FIG. 9 is an exemplary diagram showing a method 900 for transmitting a bit stream utilizing spiral based encoding. The method 900 may include the steps of transmitting a signal from one or more spiral modulation sets residing on a memory system of the software defined radio, the signal from one or more spiral modulation sets includes the bit stream segmented by a microprocessor according to modulation alphabet size 910 and receiving the signal from one or more spiral modulation sets, wherein the signal from one or more spiral modulation sets are filtered and then fed to an analog to digital converter, where the signal from the one or more spiral modulation sets may be digitized and are fed to the microprocessor 920. The transmitting step 910 may dynamically select one or more spiral modulation sets to accommodate one or more changing channel conditions and may minimize average or peak power consumption and the one or more spiral modulation sets so as to minimize an average transmitted power and minimize power consumption. The one or more spiral modulation sets for a given channel impairment may be known a priori. Each of the one or more spiral modulation sets systematically may try to determine the one or more spiral modulation sets that work optimally. A heuristic algorithm may determine the one or more optimal spiral modulation sets. The receiving step 920 may utilize one or more spiral modulation sets that may be for Additive White Gaussian Noise or AWGN impaired channels to improve recognition of a received signal at one or more frequencies. The average transmitted power may be minimized and the one or more one or more spiral modulation sets may change to minimize the average transmitted power. A plurality of modulation set data may be computed off line and stored in the memory system.

The bit stream may be segmented by the microprocessor according to the modulation alphabet size M. Thus for example, if the alphabet size M is approximately 64, then the bit stream is segmented into approximately 6 bit segments, since $2^6 = 64$. Based on the desired performance level, power consumption, hardware cost etc., the transmitter microprocessor decides a priori how many samples will be transmitted per symbol. Typical values are approximately 16 . . . 256. Based on the channel conditions, available power, regulatory limits, application limits and so on, the transmitter microprocessor decides upon a modulation set. Although in principle the number of modulation sets is unlimited, a typical radio will have between approximately 1 and 1024 modulation sets. The value $V_t$ to be transmitted at any instant t, for a modulation set $M_i$, symbol $S_j$ and symbol time $T_k$, is determined by performing an index into a 3-dimensional array located in memory system, where $V_t$=Modulation[i]·Symbol[j]·Time[k]. Successive $V_t$ are then typically passed through a bandwidth limiting filter, the characteristics of which are not relevant to the present invention. The output of the bandwidth limiting filter is utilized to drive a DAC, whose output in turn may be utilized to drive a power amplifier which in turn may drive an antenna. In some instances the power amplifier will direct a cable.

A signal transmitted in the described manner may be received by a receiver. The receiver may perform the following steps. The analog waveform may be received by the antenna, possibly filtered and amplified and then fed to an ADC where it may be digitized and the digital samples fed to a microprocessor. Based on the desired performance level, power consumption, hardware costs, etc., the receiver microprocessor decides a priori how many samples will be taken per received symbol. Typical values are approximately 16 . . . 256. Note it is common, but not required, that the transmitter and receiver utilize the same number of samples. The received samples are usually normalized to a reference power level. This set of normalized received samples may be considered the received vector R. Within the receiver there are symbol templates including a two-dimensional array stored in memory indexed by modulation type and symbol. The elements of this array are a vector of the expected set of received samples for the given modulation type and symbol number. Denote the expected vector for modulation i and symbol j to be $E_{ij}$. The receiver then compares the received vector R with each of the possible expected vectors $E_{ij}$ (j=0 . . . M−1). The comparison between the received symbol and templates may be typically performed by computing the vector dot product of R with $E_{ij}$ for all j and selecting the product with the largest value. However, the exact method is not germane except in the sense that it involves looking up a template from memory.

It should be apparent from this description that changing the spiral modulation set requires merely that an index into a lookup table be changed for both the transmitter and the receiver. As a result, a system may change spiral modulation sets at an arbitrary rate. In practice, one does not change the spiral modulation set during a symbol transmission, but rather immediately prior to transmitting a new symbol. The frequency with which the spiral modulation set is changed may be entirely application dependent. The implications of this will now be described in various exemplary instances of the invention.

In a first exemplary embodiment of the invention that accommodates changing channel conditions, the SDR may dynamically select its spiral modulation set so as to accommodate changing channel conditions. Note that in general, selection of the optimal spiral modulation set will be done with a fixed alphabet size M. That is, for a given desired throughput, which is a function of M, the objective is to determine the optimal spiral modulation set. For channels with serious impairment, it may of course be necessary to reduce the bit rate so as to achieve an acceptable Bit Error Rate or BER. An estimate of the expected BER for a given alphabet and channel conditions may be obtained by prior simulation or physical transmission tests.

For AWGN channels, a third approach to determining expected BER is to utilize a variant of a geometric approach. It is known to the art that band limited non-periodic symbol waveforms may be represented in principle by an unlimited sequence of independent points transmitted at the frequency of the channel's baseband bandwidth B. This contrasts with traditional periodic symbol waveforms, for which by the Sampling Theorem shows that at most two independent points may be transmitted at frequency B.

Applying Shannon's geometric approach on a per-symbol, rather than per-complete-signal basis, each band limited non-periodic symbol waveform w may be represented by a point in a space of dimension d, where d is the number of independent points in the specification of w. The expected BER for a given level of AWGN is proportional to the probability that the specified level of noise will displace a symbol more than half the distance to its nearest neighbor, thereby causing a symbol reception error. This probability may be determined from a Gaussian function parameterized by the distance between symbols and the level of noise.

Consider by way of example a communications channel between two mobile devices such as vehicles utilized by the emergency services. For an application such as this it is possible to identify a plethora of different channel conditions. For example, the vehicles are moving relative to each other at high speed, resulting in a communications channel subject to significant fading. The vehicles are stopped in an urban environment resulting in a communications channel that may be subject to significant multi-path interference. The vehicles are in a rural setting separated by large distances such that the communications channel may be subject to significant AWGN. The vehicles are out in an adverse weather conditions where rain fade and burst noise from lightning are significantly impacting the communications channel. In this example, the radios utilized in this communications channel contain a multitude of different spiral modulation sets that may be selected on the fly.

In a first instance of this example, the optimal spiral modulation set(s) for a given channel impairment are known a priori. In this case the receiver and transmitter agree on what the impairment is and switch to the agreed upon modulation set for the specific impairment. This approach may be useful when it is possible to easily distinguish between different impairments.

In a second instance of this example, the receiver and transmitter systematically try each of the different spiral modulation sets in order to determine those that work optimally. Having agreed upon an optimal modulation set, the radios may utilize that set indefinitely, utilize that set until the BER exceeds a certain level, at which point the radios recommence a systematic search of the spiral modulation sets to determine the new optimal spiral modulation set, periodically perform a systematic search of the spiral modulation sets to determine the new optimal spiral modulation set, irrespective of the current BER and continuously perform a systematic search of the spiral modulation sets to determine the new optimal spiral modulation set. This approach may be useful when the communications channel is not in continuous use, and thus the channel may be available for experimentation.

In a third instance of this example, the receiver and transmitter utilize a heuristic algorithm to determine the optimal spiral modulation set. By way of example, the heuristic algorithm may determine the characteristics of the channel impairment, and utilize this knowledge to perform a systematic search across a limited number of spiral modulations sets. Having agreed upon an optimal spiral modulation set, the radios may utilize that set indefinitely until the BER exceeds a certain level, at which point the radios recommence a new heuristic search of the spiral modulation sets to determine the new optimal spiral modulation set, periodically perform a heuristic search of the spiral modulation sets to determine the new optimal spiral modulation set, irrespective of the current BER and continuously perform a heuristic search of the spiral modulation sets to determine the new optimal spiral modulation set. This approach may be useful when the communications channel is not in continuous use, and thus the channel may be available for experimentation. It should be apparent to one skilled in the art that any number of algorithms may be utilized to determine the optimal modulation set for a given set of channel conditions and that the three examples given above are merely illustrative of what is possible.

For traditional modulations such as QAM, it is trivial to determine the Gray coding. For spiral based modulation, the Gray coding strategy for a given symbol set is not obvious. Because of the inherent noise resistance built into spiral based communication, it is not necessary to even utilize Gray coding. This arises because if the symbol error rate is zero, then the bit error rate is also zero, regardless of whether Gray coding, binary coding, or random coding is utilized.

In a second exemplary embodiment of the invention, the average power consumption of the transmitter is minimized and the SDR may change its modulation set so as to minimize the average transmitted power and thus minimize the transmitter's power consumption. Consider a communications channel in which the receiver is receiving a signal with more than adequate noise margin, such that the transmitter could safely transmit at reduced power. If the receiver conveys this information to the transmitter, then in classical transmitter design, the power output of the transmitter would be reduced by attenuating the magnitude of the signal fed into the power amplifier. This approach requires the presence of programmable gain (e.g., attenuator) stages in the transmit signal path.

With spiral based modulation, an alternative approach is possible. The crest factor C of a signal is defined to be the ratio of the peak to the root mean square or RMS amplitude. This is sometimes referred to as the peak-to-average ratio or PAR. The peak to average power ratio or PAPR is the ratio of the peak amplitude squared (P) to the RMS amplitude squared (A). Thus $PAPR=P/A=C^2$ and alternatively $A=P/C^2$. For spiral modulation, the crest factor of the signals may be adjusted over a large dynamic range by adjusting the factor g in Equation 3. Thus for transmitters with a fixed Peak power P, it is possible to reduce the average transmitted power A simply by changing the spiral modulation set such that the crest factor C is increased. In a practical system, changing the spiral modulation set will of course have additional impacts on the communications channel performance. However provided these additional changes still result in adequate performance, changing the modulation set so as to increase the crest factor is a viable mean of reducing transmitter power consumption.

In a third exemplary embodiment of the invention, the average transmitted power is maximized and the SDR may change its modulation set so as to maximize the average transmitted power. Consider a communications channel in which the receiver is receiving a signal with insufficient noise margin, such that the transmitter needs to transmit at an increased power level for reliable communications. If the receiver conveys this requirement to the transmitter, then in classical transmitter design, the power output of the transmitter would be increased by amplifying the magnitude of the signal fed into the power amplifier. This approach requires the presence of programmable gain (e.g., attenuator) stages in the transmit signal path. However, if the amplifier is already at maximum gain, then the transmitter has no option other than to reduce its bit rate by, for example switching from QAM64 to QPSK modulation.

With spiral modulation, an alternative approach is possible. As explained above, $P/A=C^2$. For applications where the peak power of the transmitter is limited (e.g., perhaps by regulatory fiat, or more prosaically because the transmitter's battery voltage is dropping), then it is possible to increase the average transmitted power while keeping the peak power fixed by choosing a spiral modulation set where the Crest Factor is minimized. Note that this may be done without changing the bit rate over a considerable dynamic range. In the limit of course, it is always necessary to reduce the bit rate.

In a fourth exemplary embodiment of the invention, the receiver power consumption may be minimized and the receiver may change its sampling rate and/or the transmitter changes its modulation set so as to minimize the average power consumption of the receiver. With spiral based modulation, for AWGN impaired channels, it is possible to improve the SNR by sampling the received signal at higher frequencies. As the sampling rate increases, the receiver must perform commensurately more analog-digital converter readings and run each additional sample through various digital filters. Both of these operations consume considerable power. Consequently, the power consumption of the receiver is a function of the sampling rate.

Consider a communications channel in which the receiver is receiving a signal with sufficient noise margin. In order to minimize its power consumption the receiver may elect to reduce its sampling rate such that the SNR is reduced, but is still acceptable. If the receiver's power consumption is still higher than desirable (e.g., possibly because its battery is failing), then the receiver could request that the transmitter change its spiral modulation set, such that the SNR is increased sufficiently that the receiver could in turn further drop its sampling rate and thus its power consumption.

In a fifth exemplary embodiment of the invention, the network power consumption may be minimized and the modulation set and the receiver sampling rates may be chosen so as to minimize the total power consumption across the communications network. It should be apparent that the second, third and fourth exemplary embodiments of the invention are interdependent. So while the previous embodiments have considered minimizing the power consumption of either the transmitter or the receiver without regard to the effect on the other party, it should be apparent that there are modulation sets that, while not necessarily minimizing the power consumption of the transmitter or the receiver, do minimize the power consumption of the communications channel as a whole. This is particularly true for a communications network in which a transmitted signal is received by many receivers (e.g., point to multi-point).

Determining the optimal modulation set so as to minimize network power consumption is a classic linear programming problem in which the parameter to be minimized (e.g., network power) is subject to peak power of the transmitter, average power of the transmitter, minimum SNR at each receiver and available power at each receiver. It should be apparent that for many real networks, particularly where the radios are battery powered, the optimal solution to this problem is dynamic and thus the computation needs to be performed regularly.

The foregoing description and accompanying figures illustrate the principles, one or more embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments may be made by those skilled in the art without departing from the scope of the invention as defined by the following claims.

What is claimed is:

1. A software defined radio designed for non-periodic signals, comprising:
    a memory system storing a plurality of non-periodic modulation sets;
    a microprocessor in communication with the memory system via a bus, the microprocessor includes a non-transitory storage media where one or more radio functions are implemented and a transmitter to generate a bit stream, the microprocessor segments the bit stream received from the non-periodic modulation sets stored on the memory system according to a modulation alphabet size, and the transmitter dynamically selects one or more spiral modulation sets from a plurality of spiral modulation sets of the modulation alphabet size to accommodate one or more changing channel conditions;
    a digital to analog converter in communication with the microprocessor via the bus, the digital to analog converter receives a plurality of spiral based modulations from the microprocessor, after a bandwidth limiting filter is applied, and the digital to analog converter feeds into a radio frequency stage;
    a power amplifier in communication with the digital to analog converter via the bus, the power amplifier boosting the radio frequency stage signal;
    an antenna receiving the boosted radio frequency stage, the antenna is driven by the boosted radio frequency stage by the bandwidth limiting filter; and
    an analog to digital converter in communication with the power amplifier via the bus, the analog to digital converter provides signal reception, digitizes the boosted radio frequency stage from the antenna and feeds the digitized analog signal back to the microprocessor.

2. The software defined radio according to claim 1, wherein the memory system permits the modulation sets to be instantaneously switched.

3. The software defined radio according to claim 1, wherein the microprocessor decides a priori the sequence of transitions between modulation sets.

4. The software defined radio according to claim 1, wherein the one or more spiral modulation sets for a given channel impairment are known a priori.

5. The software defined radio according to claim 1, wherein each of the one or more spiral modulation sets are systematically tried to determine the one or more spiral modulation sets that work optimally.

6. The software defined radio according to claim 5, wherein a heuristic algorithm determines the one or more optimal spiral modulation sets.

7. The software defined radio according to claim 1, wherein the one or more spiral modulation sets are designed for a plurality of Additive White Gaussian Noise impaired channels to improve a received signal at one or more frequencies.

8. The software defined radio according to claim 1, wherein the non-transitory storage media minimizes an average power consumption and the modulation sets so as to minimize an average transmitted power and minimize power consumption.

9. The software defined radio according to claim 8, wherein the average transmitted power is maximized and the modulation sets are changed to maximize the average transmitted power.

10. The software defined radio according to claim 1, wherein a plurality of modulation set data is computed off line and stored in the memory system.

11. A method for utilizing a bit stream for spiral based encoding, comprising:
    transmitting a signal from one or more spiral modulation sets residing on a memory system of a software defined radio, the signal from one or more spiral modulation sets includes the bit stream segmented by a microprocessor according to a modulation alphabet size,
    dynamically selecting one or more spiral modulation sets from a plurality of spiral modulation sets of the modulation alphabet size to accommodate one or more changing channel conditions; and
    receiving the signal from one or more spiral modulation sets, wherein the signal from one or more spiral modulation sets are filtered and then fed to an analog to digital converter, where the signal from the one or more spiral modulation sets is digitized and are fed to the microprocessor.

12. The method according to claim 11, wherein based on at least one of a performance level, power consumption and hardware cost, the microprocessor decides a priori how many of a plurality of samples will be transmitted per symbol.

13. The method according to claim 11, wherein the signal from the one or more spiral modulation sets is received by an antenna.

14. The method according to claim 11, wherein the one or more spiral modulation sets for a given channel impairment are known a priori.

15. The method according to claim 14, wherein an attempt is made to determine the one or more spiral modulation sets that work optimally.

16. The method according to claim 15, wherein a heuristic algorithm determines the one or more optimal spiral modulation sets.

17. The method according to claim 11, wherein the one or more spiral modulation sets are for a plurality of Additive White Gaussian Noise impaired channels to improve a received signal at one or more frequencies.

18. The method according to claim 11, wherein the non-transitory storage media minimizes an average power consumption and the one or more spiral modulation sets are selected so as to minimize an average transmitted power and minimize power consumption.

19. The method according to claim 18, wherein the average transmitted power is maximized and the one or more spiral modulation sets are changed to maximize the average transmitted power.

20. The method according to claim 11, wherein a plurality of modulation set data is computed off line and stored in the memory system.

21. A non-transitory computer storage media having instructions stored thereon which, when executed, execute a method comprising the steps of:
    transmitting a signal from one or more spiral modulation sets residing on a memory system of a software defined radio, the signal includes a bit stream segmented by a microprocessor according to a modulation alphabet size;
    dynamically selecting one or more spiral modulation sets from a plurality of spiral modulation sets of the modulation alphabet size to accommodate one or more changing channel conditions; and
    receiving the signal from the one or more spiral modulation sets, wherein the signal from one or more spiral modulation sets are filtered and then fed to an analog to digital converter, where the signal from the one or more spiral modulation sets is digitized and are fed to the microprocessor.

22. The non-transitory computer storage media according to claim 21, wherein based on at least one of a performance level, power consumption and hardware cost, the microprocessor decides a priori how many of a plurality of samples will be transmitted per symbol.

23. The non-transitory computer storage media according to claim 21, wherein the signal from the one or more spiral modulation sets is received by an antenna.

24. The non-transitory computer storage media according to claim 21, wherein the one or more spiral modulation sets for a given channel impairment are known a priori.

25. The non-transitory computer storage media according to claim 21, wherein an attempt is made to determine the one or more spiral modulation sets that work optimally.

26. The non-transitory computer storage media according to claim 25, wherein a heuristic algorithm determines the one or more optimal spiral modulation sets.

27. The non-transitory computer storage media according to claim 21, wherein the one or more spiral modulation sets are for a plurality of Additive White Gaussian Noise impaired channels to improve a received signal at one or more frequencies.

* * * * *